United States Patent [19]

Kato et al.

[11] Patent Number: 5,278,422
[45] Date of Patent: Jan. 11, 1994

[54] NORMALLY OPEN SOLID STATE RELAY WITH MINIMIZED RESPONSE TIME OF RELAY ACTION UPON BEING TURNED OFF

[75] Inventors: Fumio Kato; Sigeo Akiyama; Masahiro Izumi; Noriteru Furumoto, all of Kadoma, Japan

[73] Assignee: Matsushita Electric Works, Ltd., Osaka, Japan

[21] Appl. No.: 935,413

[22] Filed: Aug. 26, 1992

[30] Foreign Application Priority Data

Sep. 2, 1991 [JP] Japan ................... 3-221883

[51] Int. Cl.⁵ ............... G02B 27/00; H03K 3/42
[52] U.S. Cl. ........................ 250/551; 307/311
[58] Field of Search ..250/551, 214R, 214SW; 307/311

[56] References Cited

U.S. PATENT DOCUMENTS

| | | |
|---|---|---|
| 4,390,790 | 6/1983 | Rodriguez . |
| 4,755,697 | 7/1988 | Kinzer ........................ 250/551 |
| 4,777,387 | 10/1988 | Collins ........................ 307/311 |
| 4,801,822 | 1/1989 | Idaka et al. ................ 307/311 |
| 4,804,866 | 2/1989 | Akiyama . |
| 4,864,126 | 9/1989 | Walters et al. ............. 250/551 |
| 4,912,335 | 3/1990 | Ehalt et al. ................. 250/551 |
| 4,916,323 | 4/1990 | Hayashi et al. ............ 250/551 |
| 5,013,926 | 5/1991 | Aizawa ....................... 250/551 |
| 5,057,694 | 10/1991 | Idaka et al. ................. 250/551 |
| 5,105,090 | 4/1992 | Miyajima et al. ........... 250/551 |
| 5,138,177 | 8/1992 | Morgan et al. ............. 250/551 |
| 5,151,602 | 9/1992 | Idaka et al. . |

Primary Examiner—Michael Messinger
Attorney, Agent, or Firm—Burns, Doane, Swecker & Mathis

[57] ABSTRACT

A solid state relay circuit includes a MOSFET receiving a photovoltaic output generated across a photovoltaic diode array responsive to a light signal from a light emitting element, a control electrode of a normally ON type driving transistor made to be at a high impedance state by a voltage generated across an impedance element connected in series to the photovoltaic diode array upon application of the photovoltaic output across the gate and source of the MOSFET and at a low impedance state upon disappearance of the photovoltaic output is connected to a connecting point between the diode array and the impedance element, and the driving transistor is connected across the gate and source of the MOSFET with a resistor interposed. A falling gradient of output signal upon being turned OFF of the relay circuit is made thereby sufficiently gentle, and relay operation upon being turned OFF can be minimized in response time.

3 Claims, 3 Drawing Sheets

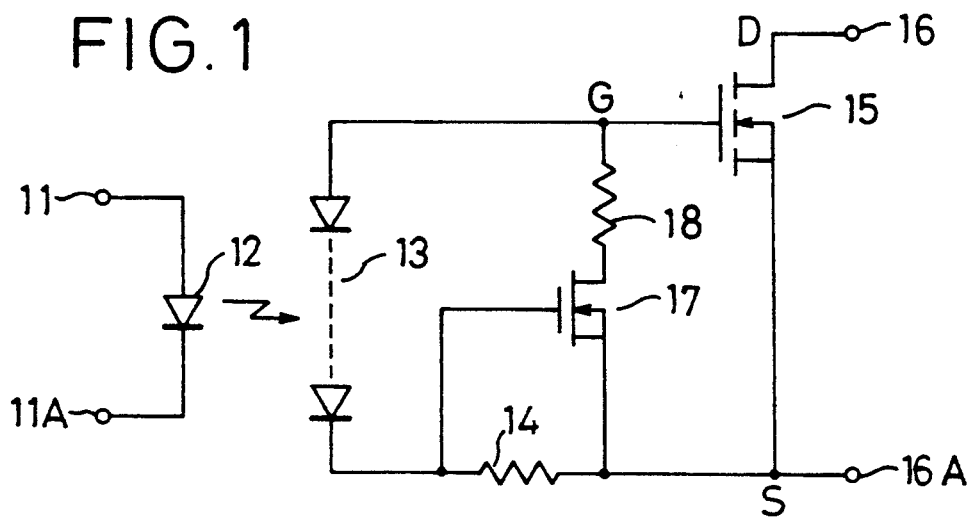
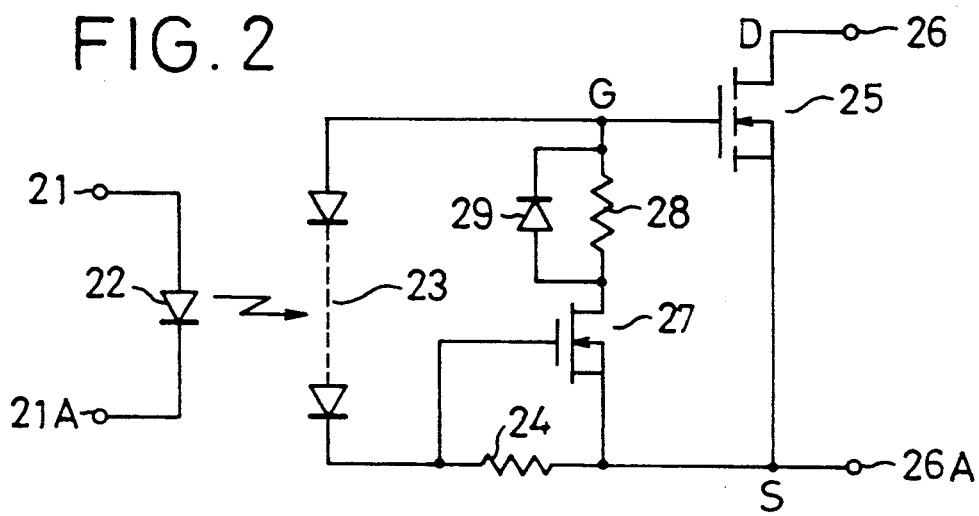
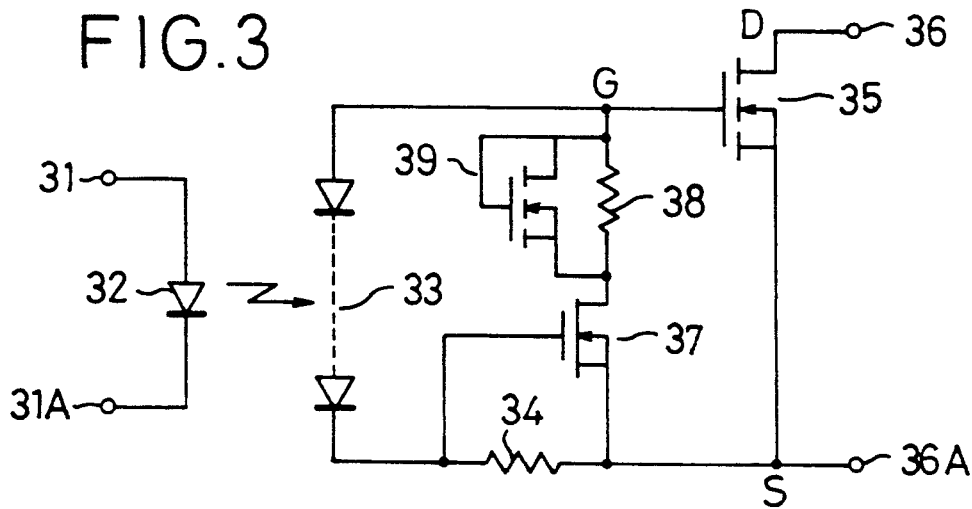

FIG. 4
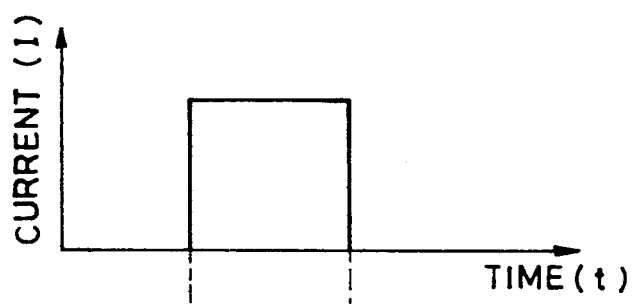
a
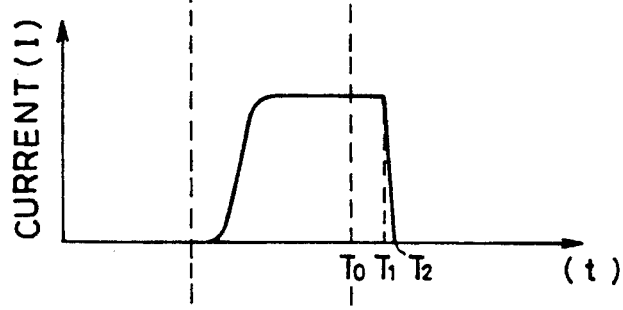
b
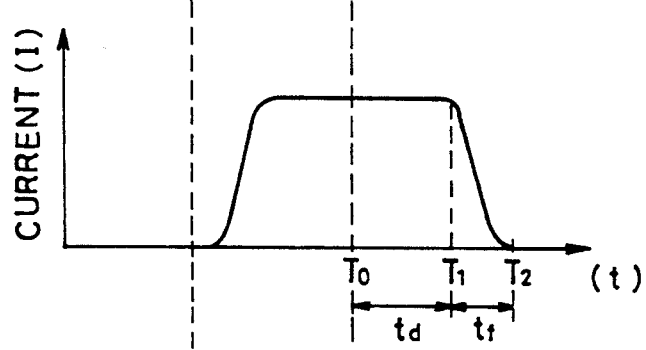
c
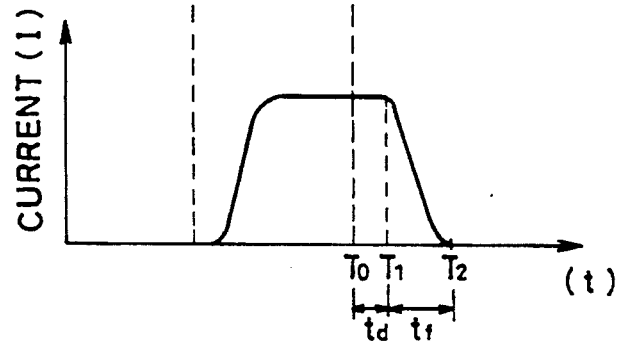
d

NORMALLY OPEN SOLID STATE RELAY WITH MINIMIZED RESPONSE TIME OF RELAY ACTION UPON BEING TURNED OFF

BACKGROUND OF THE INVENTION

This invention relates to a solid state relay and, more particularly, to a solid state relay in which a light emitting diode converts an input signal to a light signal, a photovoltaic diode array optically coupled to the light emitting diode converts the light signal to an electrical signal which is used for driving a metal-oxide-semiconductor field effect transistor (hereinafter reffered to simply as "MOSFET") as an output means to obtain a contact signal as an output.

DESCRIPTION OF RELATED ART

For the solid state relay of the kind referred to herein, there has been disclosed in U.S. Pat. No. 4,390,790 to Edward T. Rodriguez a solid state relay in which a photovoltaic diode array optically coupled to a light emitting diode is connected in series with a MOSFET, wherein across the gate and base of which a normally ON type junction FET is connected and an additional photovoltaic diode array is connected across the gate and source of this junction FET through a resistor. According to this solid state relay of Rodriguez, any instantaneous mistriggering apt to occur in the solid state relay of the kind referred to prior to Rodriguez can be prevented by the provision of the additional diode array, which can drive the normally ON type junction FET. However, the increase of the chip size due to the necessity of the additional photovoltaic diode array and the necessity of the combined circuit arrangement of the junction FET with the additional diode array has rendered a high speed relay operation difficult to achieve.

As a high speed solid state relay, there has been disclosed in U.S. Pat. No. 4,804,866 to Sigeo Akiyama such solid state relay that a photovoltaic diode array is optically coupled to a light emitting diode, an output MOSFET is connected in series to this photovoltaic diode array, a normally ON type driving transistor is connected across the gate and source of this output MOSFET, and a control electrode of this driving transistor is connected to a connecting point between the photovoltaic diode array and an impedance element, so that, upon occurrence of a photovoltaic output at the photovoltaic diode array consequent to an input current to the light emitting diode, the driving transistor will be biased into a high impedance state by a voltage generated across the impedance element. According to this relay of Akiyama, the photovoltaic output occurred at the photovoltaic diode array by the light signal from the light emitting diode is supplied across the gate and source of the output MOSFET and is made to flow as a photoelectric current through the driving transistor comprising a depletion mode field effect transistor (FET).

In an event where the output MOSFET is of N-type enhancement mode in the U.S. Patent to Akiyama, the photovoltaic output causes a current for charging a gate electrostatic capacity of the output MOSFET as well as a current flowing through the driving transistor to flow through a bias resistor as the impedance element, the gate of the driving transistor is biased to a negative voltage by a voltage across the bias resistor, the driving transistor turns instantaneously to the high impedance state so as to have the gate electrostatic capacity of the output MOSFET charged efficiently and, accompanying this, the solid state relay is caused to vary its state across both output terminals from an OFF state to an ON state. In an event when the input current to the solid state relay is interrupted, further, there occurs no photovoltaic output at the photovoltaic diode array, the current flowing through the bias resistor disappears, the driving transistor returns to the ON state, a charge accumulated in the gate electrostatic capacity of the output MOSFET is discharged through the driving transistor, and the OFF state is restored across the output terminals of the relay.

In the solid state relay of Akiyama, however, it is inherent that the rising gradient of output signal responsive to the rise of the input signal to the relay is relatively steep, and the falling gradient of the output signal responsive to the falling of the input signal becomes extremely steep. This is because, while the charge of the gate electrostatic capacity of the output MOSFET is carried out through the bias resistor and is thus relatively time-consuming, the discharge of the charge accumulated in the gate electrostatic capacity is to be performed quickly through the driving transistor made to be at the low impedance state. For this reason, the known relay has been involving a problem that, in an event where a capacitive load or an inductive load is connected to the relay, there arises a risk that a large current or a high voltage is caused to occur upon switching operation of the relay, which may happen to become a cause of electrical noise generation that may result in an erroneous operation of other associated circuits.

In addition, in a U.S. Pat. No. 5,151,602 of Yukio Idaka et al (or European Patent Application No. 0442561, or Korean Patent Application No. 91-16146), there has been suggested a solid state relay in which a photovoltaic diode array optically coupled to a light emitting diode is connected in series with an output MOSFET, a control means is connected across the gate and source of the output MOSFET so as to be at a high impedance state upon occurrence of the photovoltaic output but to be at a low impedance state upon disappearance of the photovoltaic output, and a resistor is inserted in series with respect to a path for flowing a charge current from the photovoltaic diode array to the gate and source of the output MOSFET and a further path for flowing a discharge current from a capacity across the gate and source of the output MOSFET to the control means. According to this relay, the capacity across the gate and source of the output MOSFET is charged through the inserted resistor upon turned ON, so that a response time from the rising of the input signal to the rising of the output signal will be caused to be relatively long to render the gradient of the rising of the output signal to be gentle. Upon turning OFF, on the other hand, the accumulated charge at the capacity across the gate and source of the output MOSFET is discharged through the control means and the series connected resistor, so that the response time from the input signal falling to the output signal falling will be caused to be long enough for rendering the gradient of the output signal falling to be gentle. With such arrangement, any electrical noise occurrence is prevented, and it is made possible to set the rising time upon the turning ON as well as the falling time upon the turning OFF respectively independently by means of the resistor inserted between the control means and the source of the output MOSFET as well as a diode connected in parallel to the said resistor.

In the above relay of Idaka et al, however, the resistor for regulating the rising time acts as an element for determining the lowest required input current for turning ON the solid state relay with a threshold voltage of a controlling FET, i.e., working current, and this working current is subjected to a restriction by means of the regulation of the rising time. Further, the connection of the diode in parallel to the resistor for regulating the falling time, the voltage across the gate and source of the output MOSFET upon the turning ON is caused to be lower by a forward voltage of this diode, and it become necessary to increase by one cell the number of cells forming the photovoltaic diode array. Further, the discharge of the accumulated charge in the gate and source capacity of the output MOSFET upon disappearance of the photovoltaic output is to be carried out not only through the control means but also through the photovoltaic diode array in initial stage of the discharge, that is, so long as the gate voltage of the output MOSFET is higher than the forward voltage of the photovoltaic diode array, in the latter event of which there arises a problem that the discharge current through the photovoltaic diode array is restricted by the resistor for the falling time regulation and the response time of the relay operation upon turning OFF is caused to be longer than that required.

SUMMARY OF THE INVENTION

Accordingly, a primary object of the present invention is to provide a solid state relay which has eliminated the foregoing problems and which is capable of preventing the occurrence of the electric noise by rendering a gentle falling gradient of the output signal upon being turned OFF and a minimum response time of the relay operation upon being turned OFF without affecting turning ON operation.

According to the present invention, the above objects can be realized by means of a solid state relay in which a photovoltaic diode array is optically coupled to a light emitting element for generating a photovoltaic output with a light signal received from the light emitting element as generated therein and emitted therefrom upon receiving an input current, an impedance element is connected in series to the photovoltaic diode array, an output MOSFET is connected to the photovoltaic diode array for varying its state from a first impedance state to a second impedance state upon application of the photovoltaic output across the gate and source of the MOSFET, and a control means is connected between the gate and source of the MOSFET for being rendered to be at a high impedance state upon generation of the photovoltaic output and at a low impedance state upon disappearance of the photovoltaic output, characterized in that the control means comprises a normally ON type driving transistor which is biased into a high impedance state by a voltage generated across the impedance element upon generation of the photovoltaic output at the photovoltaic diode array, and the driving transistor is connected at a control electrode thereof to a connecting point between the photovoltaic diode array and the impedance element while the driving transistor is connected across the gate and source of the output MOSFET with a resistor interposed.

Other objects and advantages of the present invention shall become clear as following description of the present invention advances with references to preferred embodiments of the invention shown in accompanying drawings.

BRIEF DESCRIPTION OF THE DRAWINGS

FIG. 1 shows in a circuit diagram an embodiment of the solid state relay according to the present invention;

FIG. 2 shows in a circuit diagram another embodiment of the solid state relay according to the present invention;

FIG. 3 shows in a circuit diagram still another embodiment of the solid state relay according to the present invention;

FIGS. 4a, 4b, 4c, and 4d show in wave-form diagrams the operation of the solid state relay shown in FIGS. 1 to 3;

Figure 5:
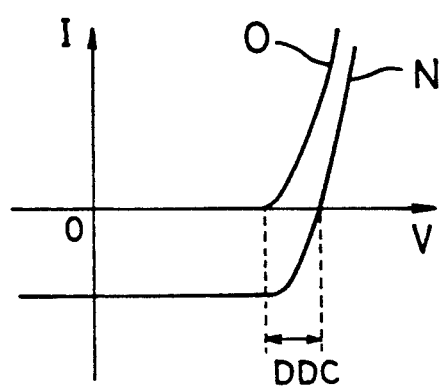
FIG. 5 shows graphically the relationship between the voltage and current of the photovoltaic diode array employed in the solid state relay according to the present invention.

While the present invention shall be described with reference to the preferred embodiments shown in the drawings, it will be readily appreciated that the intention is not to limit the invention only to these embodiments but rather to include all alterations, modifications and equivalent arrangements possible within the scope of appended claims.

DETAILED DESCRIPTION OF THE PREFERRED EMBODIMENTS

Referring to FIG. 1, there is shown an embodiment of a solid state relay according to the present, invention, in which a light emitting element 12 such as a light emitting diode is connected across input terminals 11 and 11A of the solid state relay, and a photovoltaic diode array 13 is optically coupled to the light emitting diode 12. The number of diodes connected in series in the photovoltaic diode array 13 is set so that the array generates a voltage higher than a threshold voltage of an output MOSFET 15 connected at its gate G and source S in series to the photovoltaic diode array 13 through an impedance element 14 such as a resistor. This output MOSFET 15 is of an N-channel type enhancement mode, and its drain D and source S form a pair of output terminals 16 and 16A of the solid state relay.

Across the gate G and source S of the output MOSFET 15, there is inserted a normally ON type driving transistor 17 of N-channel depletion mode, in parallel relation to the photovoltaic diode array 13. In this case, the driving transistor 17 is connected at its drain through a resistor 18 to the gate G of the output MOSFET 15, at its gate to a connecting point between the photovoltaic diode array 13 and the resistor 14, and at its source to the source S of the output MOSFET 15.

The operation of the solid state relay in FIG. 1 shall be referred to next. Now, as an input current is caused to flow between the input terminals 11 and 11A of the relay, the light emitting diode 12 generates a light signal, which is received by the photovoltaic diode array 13, and a photovoltaic output is generated at both ends of the diode array 13. This photovoltaic output is applied across the gate G and source S of the output MOSFET 15, and is also supplied through the normally ON type driving transistor 17 and the resistor 18. At this time, a current for charging an electrostatic capacity at the gate G of the output MOSFET 15 as well as a current flowing through the driving transistor 17 and resistor 18 are caused to flow through the resistor 14 forming the impedance element. A voltage generated across the resistor 14 causes the gate electrode of the driving transistor 17 to be negatively biased, the driving transistor 17 is instantaneously turned to a high impedance state, and, in response thereto, a high impedance state across the output terminals 16 and 16A changes to a low impedance state. Here, the resistor 18 does not limit the charge of the electrostatic capacity at the gate G of the output MOSFET 15, and the relay is not affected in its turning ON operation by the presence of the resistor 18.

In an event when the input current to the input terminals 11 and 11A of the relay is interrupted, the photovoltaic diode array 13 no longer generates a photovoltaic output, and consequently the current flowing through the resistor 14 disappears, the biasing with respect to the gate of the driving transistor 17 is released, and the driving transistor 17 returns to an ON state. In response to this, a charge accumulated in the gate electrostatic capacity of the output MOSFET 15 is discharged gradually through the resistor 18 and the driving transistor 17, and a high impedance state is restored across the output terminals 16 and 16A of the relay. If the resistor 18 was absent, the discharge of the accumulated charge at the gate electrostatic capacity of the output MOSFET 15 would be instantaneously completed. With the insertion of the resistor 18 of such optimum value as several megohm, the discharge current of the gate electrostatic capacity of the output MOSFET 15 is limited by the resistor 18, so that the switching OFF time is prolonged and the fall of output wave form of the relay is made gradual.

Referring more specifically to the operation, an input of a pulse signal such as shown in FIG. 4a to the input terminals 11 and 11A of the relay results, in the absence of the resistor 18, in such output signal across the output terminals 16 and 16A of the relay as shown in FIG. 4b, in which the fall of the wave form upon turning OFF of the relay's switching operation is very steep, so as to permit noise to be readily generated. With the insertion of the resistor 18, on the other hand, the output signal across, the output terminals 16 and 16A is of a wave form such as shown in FIG. 4c in which the OFF time of the relay's switching operation is prolonged and the fall of the wave form is made gradual, so as to restrict the noise generation. In the wave form of FIG. 4c, $t_d$ denotes the time from the interruption of the input current to a starting point of the turning OFF, and $t_f$ denotes the time from the starting point to a completing point of the turning OFF. That is, the time $t_d$ is the one for which the voltage across the gate and source of the output MOSFET 15 decreases from the photovoltaic voltage of the diode array 13 to a required across-gate-and-source voltage $V_{GS(on)}$ for turning the output MOSFET 15 to ON state, and the time $t_f$ is the one for which the voltage across the gate and source of the output MOSFET 15 decreases from the voltage $V_{GS(on)}$ to the threshold voltage $V_{th}$ of the output MOSFET 15.

Further, provided that the resistor 18 was absent in the discharge path of the gate electrostatic capacity of the output MOSFET 15, in particular, in the discharge path of the gate G and source S of the output MOSFET 15, when the inductive load is connected across the output terminals, a reverse electromotive voltage occurring upon the switching operation of the relay would be clamped to be over a breakdown voltage of the output MOSFET 15 and would exceed a load voltage, and it was required to provide a protective circuit. With the insertion of the resistor 18 in the discharge path of the gate G and source S of the output MOSFET 15, as in the embodiment of FIG. 1, the reverse electromotive voltage generated upon the relay's switching operation is made to be below the load voltage of the output MOSFET 15, and no protective circuit is required.

In FIG. 2, there is shown another embodiment of the solid state relay according to the present invention, in which a constant-voltage element 29 is additionally connected in parallel to the resistor 28 inserted in series with the driving transistor 27, as will be clear when compared with the foregoing embodiment of FIG. 1. For this constant-voltage element 29, a Zener diode is employed, preferably, as connected to render a direction from the source S to the gate G of the output MOSFET 25 to be forward. A Zener voltage $V_z$ of this Zener diode 29 is set to be of a balance of a subtraction of voltage drop upon turning ON of the driving transistor 27 from the across-gate-and-source voltage $V_{GS(on)}$ of the output MOSFET 25, and the discharge of the accumulated charge in the gate electrostatic capacity of the output MOSFET 25 is to be carried out as will be described in the following.

When the across-gate-and-source voltage of the output MOSFET 25 is above $V_{GS(on)}$, a voltage across the both ends of the Zener diode 29 is more than the Zener voltage $V_z$, so that the discharge of the accumulated charge at the gate electrostatic capacity of the output MOSFET 25 can be quickly performed through the Zener diode 29 and driving transistor 27. Further, in the initial stage of the discharge, a sufficiently large voltage is applied across the photovoltaic diode array 23 to keep the array in the ON state, and the discharge current is caused to flow also through the photovoltaic diode array 23 and resistor 24. At this time, the gate electrode of the driving transistor 27 is positively biased, the driving transistor 27 is turned to a further lower impedance state with an enhancement effect of the MOSFET, and the discharge is accelerated.

When the voltage across the gate G and source S of the output MOSFET 25 becomes below $V_{GS(on)}$, the voltage across the Zener diode 29 becomes below the Zener voltage $V_z$, the Zener diode 29 is thereby turned to OFF state, and the discharge of the gate electrostatic capacity of the output MOSFET 25 is gradually performed through the resistor 28 and driving transistor 27.

In the embodiment of FIG. 2, such pulse signal as shown in FIG. 4a is applied across the input terminals 21 and 21A to have the light signal generated by the light emitting element 22, and the output signal across the output terminals 26 and 26A is as shown in FIG. 4d. That is, the discharge of the accumulated charge at the gate electrostatic capacity of the output MOSFET 25 is carried out quickly for a period $T_0$-$T_1$ and then gradually for a period $T_1$-$T_2$, so that what is called the delay time $t_d$ in the output wave form upon the turning OFF of the relay's switching operation can be shortened while the falling time $t_f$ can be prolonged to render a gentle falling gradient.

While in the above the disposition of the resistor 28 has been referred to as being connected to the drain of the driving transistor 27, the resistor 28 may be connected to the source of the driving transistor 27. However, in an event when the resistor is connected in series with the impedance-element resistor 24 to be between the connecting point of the source of the driving transistor 27 to the resistor 24 and the source S of the output MOSFET 25, that is, in the same manner as in the foregoing known relay of Idaka et al, when the driving transistor 27 becomes ON state, a potential difference between the gate G and the source S of the output MOSFET 25 is applied to both ends of this resistor connected in series with the resistor 24, that is, a potential at the connecting point of the source of the driving transistor 27 to the resistor 24 rises, then the discharge current at the initial stage of the discharge through the photovoltaic diode array 23 and the resistor 24 cannot flow. More specifically with reference to FIG. 5, there flows a discharge current in accordance with a potential difference DDC between a current curve 0 responsive to increment in the voltage in the absence of the input signal to the input terminals 21 and 21A of the relay and the other current curve N responsive to increment in the voltage in the presence of the input signal, as shown in the IV characteristics of the photovoltaic diode array 23 of FIG. 5, however, the potential difference between the gate G of the output MOSFET 25 and the connecting point of the source of the driving resistor 27 and the resistor 24 is made smaller due to the potential rise at the connecting point of the source of the driving resistor 27 and the resistor 24, consequent to which the discharge of the gate electrostatic capacity of the output MOSFET 25 is made not to flow through the path of the photovoltaic diode array 23 and resistor 24, and the relay's delay time is made longer and the relay's switching is caused to be excessively time-consuming.

Figure 6:
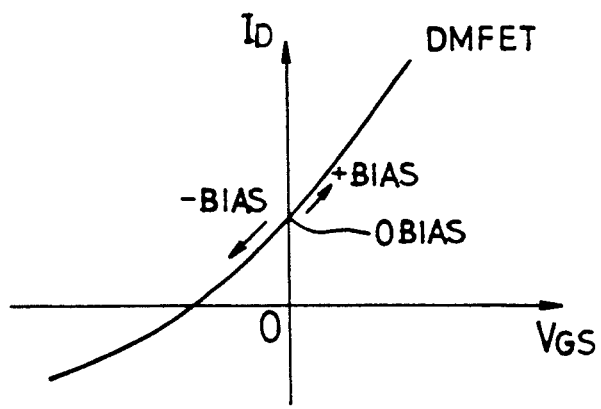
FIG. 6 shows graphically the relationship between the voltage and current of the depletion mode FET employed in the solid state relay according to the present invention.

In the embodiment of FIG. 2, on the other hand, the discharge current flows through the photovoltaic diode array 23 and the resistor 24 and the gate electrode of the driving transistor 27 is positively biased by the discharge current flowing through the resistor 24, so that the driving transistor 27 is rendered to be further lower impedance state by the enhancement effect of the MOSFET as has been partly referred to (see FIG. 6), and the discharge can be accelerated by an increment in the discharge current which flowing through the path of the gates of the output MOSFET 25, Zener diode 29, driving transistor 27 and the sources of the output MOSFET 25. As the voltage across the gate G and source S of the output MOSFET 25 decreases to reach $V_{GS(on)}$, next, the discharge is to be carried out through the resistor 28 and driving transistor 27 in gradually as has been referred to.

Other constituents and their function in the embodiment of FIG. 2 are the same as those in the embodiment of FIG. 1.

Now, in still another embodiment of the present invention as shown in FIG. 3, the constant voltage element in the foregoing embodiment of FIG. 2 is replaced by an enhancement type MOSFET 39 connected to be in parallel with the resistor 38 in series connection with the driving transistor 37 and to be short-circuited at the gate and drain. In the present instance, the enhancement type MOSFET 39 is kept at the low impedance state until the voltage across the resistor 38 drops to a predetermined value, so that the discharge of the accumulated charge at the gate electrostatic capacity of the output MOSFET 35 can be quickly performed. As the voltage across the resistor 38 drops to be below the predetermined value, the enhancement type MOSFET 39 turns to the high impedance state, and the discharge of the accumulated charge at the gate electrostatic capacity of the output MOSFET 35 is carried out gradually through the resistor 38. It should be appreciated that, similar to the embodiment of FIG. 2, the delay time $t_d$ in the output wave form upon the turning OFF of the relay's switching operation can be shortened while prolonging the falling time $t_f$ so as to render the falling gradient to be gentle.

In the embodiment of FIG. 3, all other constituents and their function are the same as those in the embodiment of FIG. 1, and the same constituents in FIG. 3 as those in the embodiment of FIG. 1 are denoted by the same reference numerals as those used in FIG. 1 but with "20" added thereto.

What is claimed is:

1. A normally open solid state relay with minimized response time of relay action upon being turning OFF, comprising:

a light emitting element which emits a light signal upon receipt of an input current, a photovoltaic diode array optically coupled to said light element for generating a photovoltaic output upon receipt of said light signal from the light emitting element, an impedance element connected in series with said photovoltaic diode array, an output MOSFET of a normally OFF type connected to said photovoltaic diode array for being varied from first impedance state to second impedance state with said photovoltaic output applied across the gate and source of said MOSFET, a normally ON type driving transistor connected across the gate and source of said output MOSFET to be biased into a high impedance state by a voltage generated across said impedance element upon application of said photovoltaic output across the gate and source of said output MOSFET but turned into a low impedance state upon disappearance of the photovoltaic output, said driving transistor having a control electrode connected to a connecting point between said photovoltaic diode array and said impedance element, a resistor interposed in a connection between said normally ON type driving transistor and said gate of said output MOSFET, and a constant element connected in parallel with said resistor.

2. A relay according to claim 1, wherein said constant voltage element is a Zener diode rendering a direction from the source to the gate of said output MOSFET to be forward.

3. A relay according to claim 1, wherein said constant voltage element is an enhancement type MOSFET connected at its drain and source across said resistor and short-circuited at its gate and drain.

* * * * *